United States Patent
Hong et al.

(10) Patent No.: US 10,306,818 B2
(45) Date of Patent: May 28, 2019

(54) MULTI-LAYER GRAPHENE-METAL-POLYMER SHEET FOR SHIELDING ELECTROMAGNETIC WAVE

(71) Applicants: LG Chem, Ltd., Seoul (KR); Korea Advanced Institute Of Science And Technology, Daejeon (KR)

(72) Inventors: Soon Hyung Hong, Daejeon (KR); Ho Jin Ryu, Daejeon (KR); Jae Young Oh, Daejeon (KR); Hye Ji Im, Daejeon (KR)

(73) Assignees: LG Chem, Ltd. (KR); Korea Advanced Institute Of Science And Technology (KR)

( * ) Notice: Subject to any disclaimer, the term of this patent is extended or adjusted under 35 U.S.C. 154(b) by 0 days.

(21) Appl. No.: 15/487,631

(22) Filed: Apr. 14, 2017

(65) Prior Publication Data
US 2018/0279518 A1    Sep. 27, 2018

(30) Foreign Application Priority Data
Mar. 27, 2017    (KR) .................. 10-2017-0038554

(51) Int. Cl.
B32B 9/00    (2006.01)
H05K 9/00    (2006.01)
B32B 5/16    (2006.01)
B32B 9/04    (2006.01)

(52) U.S. Cl.
CPC ............ *H05K 9/0088* (2013.01); *B32B 5/16* (2013.01); *B32B 9/04* (2013.01); *H05K 9/0083* (2013.01); *B32B 2307/212* (2013.01); *B32B 2309/105* (2013.01)

(58) Field of Classification Search
CPC .......................... Y10T 428/30; B82Y 30/00
USPC ........................................ 428/408; 252/501
See application file for complete search history.

(56) References Cited

U.S. PATENT DOCUMENTS

| | | | |
|---|---|---|---|
| 2003/0122111 A1* | 7/2003 | Glatkowski | B82Y 10/00 252/500 |
| 2007/0284557 A1* | 12/2007 | Gruner | B82Y 30/00 252/500 |
| 2011/0160372 A1 | 6/2011 | Youm et al. | |

(Continued)

FOREIGN PATENT DOCUMENTS

KR    20110078265 A    7/2011

OTHER PUBLICATIONS

Batrakov, K., et al., "Flexible transparent graphene/polymer multilayers for efficient electromagnetic field absorption." Scientific Reports, vol. 4, Article No. 7191, Published Nov. 26, 2014, pp. 1-5.

(Continued)

*Primary Examiner* — Daniel H Miller
(74) *Attorney, Agent, or Firm* — Lerner, David, Littenberg, Krumholz & Mentlik, LLP

(57) ABSTRACT

The present invention relates to a multi-layer graphene-metal-polymer sheet for shielding electromagnetic wave, wherein an electromagnetic wave shielding effect is able to be increased by using graphene-metal nanocomposite powder in which graphene and metal particles are bonded as a conductive material and by constituting a multi-layer structure instead of increasing a content of the graphene-metal nanocomposite powder.

10 Claims, 2 Drawing Sheets

(56) References Cited

U.S. PATENT DOCUMENTS

2011/0256014 A1* 10/2011 Hong .................... C22C 1/0425
  419/11
2014/0113086 A1* 4/2014 Greenhill .................. F41H 1/04
  428/34.1

OTHER PUBLICATIONS

Im, et. al., "Mutlilayer structure design of GNP/Ni/PMMA nanocomposites for enhanced EMI sheilding." The 3rd Korean Graphene Symposium, Apr. 14-15, 2016 / LOTTE Resort Buyeo, Korea, p. 18.

* cited by examiner

MULTI-LAYER GRAPHENE-METAL-POLYMER SHEET FOR SHIELDING ELECTROMAGNETIC WAVE

CROSS-REFERENCE TO RELATED APPLICATION(S)

This application claims priority to and the benefit of Korean Patent Application No. 10-2017-0038554 filed in the Korean Intellectual Property Office on Mar. 27, 2017, the entire contents of which are incorporated herein by reference.

TECHNICAL FIELD

The present invention relates to a multi-layer graphene-metal-polymer sheet for shielding electromagnetic wave.

BACKGROUND OF ART

Human bodies as well as electronic devices are greatly influenced by electromagnetic interference (EMI) due to rapid increase in the use of electromagnetic waves.

A metal or a conductive material is used for shielding EMI in the prior art. The metal or the conductive material having a low impedance reflects and shields most of the electromagnetic waves due to a difference with impedance of air. However, shielding by reflection has a problem that secondary interference of reflected waves may occur.

Graphene is in the limelight as a substitute for conventional materials for shielding EMI. The graphene has advantages of low density and high corrosion resistance as compared with conventional material for shielding EMI such as metals, due to excellent electrical conductivity and large surface area. For these reasons, a nanocomposite material in which graphene, a conductive filler, and a polymer are complexed has been developed as a material for shielding electromagnetic wave. However, a content of the conductive filler should be increased to improve an electromagnetic wave shielding effect, which has problems of dispersion in the polymer, a decrease in impedance, an increase in weight, and an increase in cost.

Therefore, the present inventors found that at the time of manufacturing a multi-layer graphene-metal-polymer sheet for shielding electromagnetic wave having a multi-layer structure in which contents of conductive fillers are different from each other, instead of increasing a content of the conductive filler, the electromagnetic wave shielding effect was remarkably improved as compared with a sheet for shielding electromagnetic wave having a single-layer structure in which contents of conductive fillers are the same as each other, and completed the present invention.

DETAILED DESCRIPTION OF THE INVENTION

Technical Problem

The present invention has been made in an effort to provide a multi-layer graphene-metal-polymer sheet for shielding electromagnetic wave. In addition, the present invention has been made in an effort to provide a method of manufacturing the multi-layer graphene-metal-polymer sheet for shielding electromagnetic wave.

Technical Solution

An exemplary embodiment of the present invention provides a multi-layer graphene-metal-polymer sheet for shielding electromagnetic wave including:

graphene-metal nanocomposite powder in which graphene and metal particles are bonded; and a graphene-metal-polymer sheet formed by mixing the graphene-metal nanocomposite powder with a polymer material;

wherein the graphene-metal-polymer sheet is stacked in multi-layers, and contents of the graphene-metal nanocomposite powder in the adjacent layers are different from each other.

The present invention relates to a multi-layer graphene-metal-polymer sheet for shielding electromagnetic wave, and term 'electromagnetic wave shielding' includes reflection and absorption of electromagnetic wave. In general, a conductive material is used for shielding electromagnetic wave. In the present invention, graphene-metal nanocomposite powder in which graphene and metal particles are bonded is used as the conductive material.

In addition, a content of the conductive material is required to be increased to improve an electromagnetic wave shielding effect, which has problems of deterioration of dispersion in a polymer, a decrease in impedance, an increase in weight, and an increase in cost.

Accordingly, in the present invention, a single layer including a polymer and a conductive material may be constituted as a plurality of layers, thereby improving the electromagnetic wave shielding effect without increasing the content of the conductive material.

Particularly, the multi-layer graphene-metal-polymer sheet for shielding electromagnetic wave according to the present invention is characterized in that contents of the graphene-metal nanocomposite powder in the adjacent layers are different from each other.

According to an exemplary embodiment to be described later, as a result of comparing the multi-layer graphene-metal-polymer sheet for shielding electromagnetic wave according to the present invention with a single layer sheet including the graphene-metal nanocomposite powder having the same content in view of the electromagnetic wave shielding effect, it could be confirmed that the electromagnetic wave shielding effect of the multi-layer graphene-metal-polymer sheet for shielding electromagnetic wave according to the present invention was remarkably excellent.

Preferably, the content of the graphene-metal nanocomposite powder relative to a total weight of the respective layers is 1 wt % or more to 70 wt % or less.

In addition, thicknesses of the respective layers may be suitably adjusted as required, and may be preferably 0.1 to 1.0 mm, respectively.

Polymers included in the graphene-metal-polymer sheet are not specifically limited, and the polymers included in the respective layers may be the same as each other or different from each other. Preferably, the polymers may be each independently polymethyl methacrylate (PMMA), epoxy, polystyrene, polyaniline (PANI), polyurethane, polyethylene, polypyrrole, polydimethylsiloxane (PDMS), polycarbonate (PC), polyvinyl chloride (PVC), polypropylene (PP), polyethylene terephthalate (PET), polyparaphenylene (PPP), polythiophene (PT), or polyisothionaphthene (PITN).

In addition, the graphene-metal nanocomposite powder has a form in which metal nanoparticles are bonded to a surface of the graphene, and may be manufactured by a process of binding the metal nanoparticles using functional groups on the surface of the graphene.

Specifically, the graphene-metal nanocomposite powder may be prepared by a preparation method including the following steps:

1) dispersing graphene oxide in a solvent;

2) adding a salt of a metal to the solvent in which the graphene oxide is dispersed;

3) oxidizing the salt of the metal in the solvent to form a metal oxide; and 4) performing heat treatment on the graphene oxide and the metal oxide in a reducing atmosphere.

The metal nanoparticles may be Ni or Co nanoparticles. Diameters of the metal nanoparticles may be preferably 5 nm to 10 μm. In addition, metal salts of Ni or Co are preferably used to prepare the metal nanoparticles, and acetates, nitrates, chlorides, sulfates, or carbonates may be used as the metal salts.

Further, a weight of the metal nanoparticles relative to a total weight of the graphene and metal nanoparticles is preferably 1 wt % to 50 wt % in the graphene-metal nanocomposite powder. In addition, the heat treatment is preferably performed at a temperature of 300 to 600° C. for 0.5 to 5 hours.

Further, the graphene-metal nanocomposite powder included in the respective graphene-metal-polymer sheet layers may be the same as each other or different from each other.

Further, the multi-layer graphene-metal-polymer sheet for shielding electromagnetic wave according to the present invention may further include a new layer on the other surface of the multi-layer graphene-metal-polymer sheet, if necessary.

The new layer on the other surface is added to improve the electromagnetic wave shielding effect, and may include a polymer and the graphene-metal nanocomposite powder, or may include a polymer and metal nanoparticles. Here, the polymer, the metal nanoparticles, and the graphene-metal nanocomposite powder used herein are as described above.

In addition, the present invention provides a method of manufacturing the above-described multi-layer graphene-metal-polymer sheet for shielding electromagnetic wave including the following steps:

1) a step of manufacturing respectively layers using a mixture of a polymer and graphene-metal nanocomposite powder, 2) a step of stacking the respective layers, and respective contents of the mixed graphene-metal nanocomposite powder in the adjacent layers of the respective layers are different from each other.

The step 1 is a step of manufacturing the respective layers of the graphene-metal-polymer sheet described above, respectively, wherein the respective layers are manufactured by using a mixture of the polymer and the graphene-metal nanocomposite powder.

When the polymer and the graphene-metal nanocomposite powder are mixed, it is preferred to mix the polymer and the graphene-metal nanocomposite powder using a solvent, and then, to remove the solvent. As the solvent, chloroform, toluene, or chlorobenzene may be used.

In addition, when the respective layers are manufactured by using the mixture, it is preferred to use a hot press. Here, it is preferred to remove foams included in the mixture. For example, the foams may be removed by placing the mixture under vacuum at 60 to 70° C.

The step 2 is a step of stacking the respective layers manufactured above, and is preferably performed by using the hot press.

Advantageous Effects

As described above, the multi-layer graphene-metal-polymer sheet for shielding electromagnetic wave according to the present invention may increase an electromagnetic wave shielding effect by using the graphene-metal nanocomposite powder as the conductive material and by constituting a multi-layer structure instead of increasing a content of the graphene-metal nanocomposite powder.

DETAILED DESCRIPTION OF THE EMBODIMENTS

Figure 1:
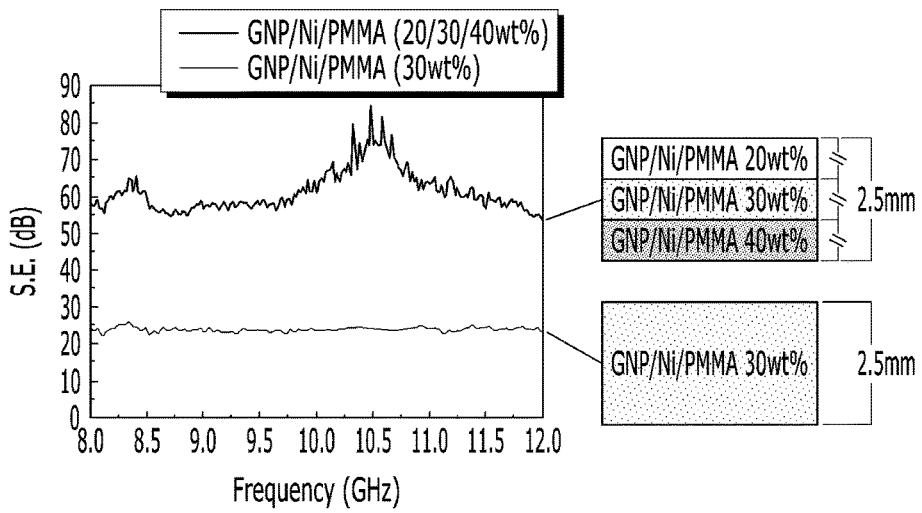
FIG. 1 shows results of comparison between Example 1 and Comparative Example 1 in view of an electromagnetic wave shielding effect.

Hereinafter, preferred exemplary embodiments of the present invention will be described in order to facilitate understanding of the present invention. However, the following exemplary embodiments are provided only to more easily understand the present invention. The present invention is not limited thereto.

Preparation Example 1: Preparation of GNP/Ni Nanocomposite Powder in which GNP and Ni Particles are Bonded GNP (0.5 g) was added to ethyleneglycol (500 mL), and mixed for 2 hours. Nickel (II) acetate (0.966 g) was added to the mixture, and mixed for 30 minutes. 2M NaOH (5 mL) was added to the mixture, and treated at 60° C. for 1 hour. Hydrazine (5 mL) was then added thereto, and the mixture was treated at 60° C. for 2 hours. The mixture was cooled to room temperature, and the solvent, ethylene glycol, was removed through a filtering process. Next, the solvent of the GNP/Ni nanocomposite powder in which the GNP and the Ni particles were bonded was completely removed in a vacuum oven. The bonded GNP/Ni nanocomposite powder was reduced in a hydrogen atmosphere at 400° C. for 3 hours to prepare GNP/Ni nanocomposite powder in which the GNP and the Ni nanoparticles were bonded.

Preparation Example 2: Manufacture of GNP/Ni/PMMA Single Layer Sheet

The bonded GNP/Ni nanocomposite powder (0.46 g) prepared in Preparation Example 1 and polyvinylpyrrolidone (PVP; Mw=40,000; 0.0346 g) were added to chloroform (16 mL), and mixed to prepare a first mixture. In addition, polymethyl methacrylate (Mw=120,000; 1.84 g) was added to chloroform (15 mL), and mixed to prepare a second mixture, separately. The first mixture and the second mixture were mixed, and treated at 65° C. for 2 hours to remove the solvent, chloroform. Next, gas included in the mixture was removed at 60 to 70° C. under vacuum for 12 hours. A sheet having a thickness of about 0.83 mm was then manufactured by a hot press (130° C., 30 MPa, and 10 min), which was designated as 'GNP/Ni/PMMA 20 wt %'.

In addition, sheets were manufactured in the same manner as above except that contents of the bonded GNP/Ni nanocomposite powder were 30 wt %, 35 wt % and 40 wt %, respectively, and the manufactured sheets were designated as 'GNP/Ni/PMMA 30 wt %', 'GNP/Ni/PMMA 35 wt %', and 'GNP/Ni/PMMA 40 wt %', respectively.

Preparation Example 3: Manufacture of GNP/PMMA Single Layer Sheet

GNP/PMMA single layer sheets were manufactured in the same manner as in Preparation Example 2 except that GNP was used instead of the bonded GNP/Ni nanocomposite powder. The manufactured sheets were designated as 'GNP/PMMA 20 wt %', 'GNP/PMMA 30 wt %', and 'GNP/PMMA 40 wt %', respectively, depending on contents of GNP.

Preparation Example 4: Manufacture of Ni/PMMA Single Layer Sheet

A Ni/PMMA single layer sheet was manufactured in the same manner as in Preparation Example 2 except that Ni was used instead of the bonded GNP/Ni nanocomposite powder. The manufactured sheet was designated as Ni/PMMA 15 wt %' depending on a content of Ni.

Example 1: Manufacture of Multi-Layer Sheet (40/30/20)

The GNP/Ni/PMMA 40 wt % single layer sheet, the GNP/Ni/PMMA 30 wt % single layer sheet, and the GNP/Ni/PMMA 20 wt % single layer sheet manufactured in Preparation Example 2 were sequentially stacked to manufacture a sheet having a thickness of about 2.5 mm by a hot press (130° C., 30 MPa, and 10 min).

Example 2: Manufacture of Multi-Layer Sheet (40/35/30)

The GNP/Ni/PMMA 40 wt % single layer sheet, the GNP/Ni/PMMA 35 wt % single layer sheet, and the GNP/Ni/PMMA 30 wt % single layer sheet manufactured in Preparation Example 2 were sequentially stacked to manufacture a sheet having a thickness of about 2.5 mm by a hot press (130° C., 30 MPa, and 10 min).

Example 3: Manufacture of Multi-Layer Sheet (40/30/20/15)

The GNP/Ni/PMMA 40 wt % single layer sheet, the GNP/Ni/PMMA 30 wt % single layer sheet, and the GNP/Ni/PMMA 20 wt % single layer sheet manufactured in Preparation Example 2, and the Ni/PMMA 15 wt % single layer sheet manufactured in Preparation Example 4 were sequentially stacked to manufacture a sheet having a thickness of about 2.5 mm by a hot press (130° C., 30 MPa, and 10 min).

Comparative Example 1

The GNP/Ni/PMMA 30 wt % single layer sheet manufactured in Preparation Example 2 was formed to have a thickness of about 2.5 mm, and the formed sheet was used as Comparative Example.

Comparative Example 2

The GNP/PMMA 40 wt % single layer sheet, the GNP/PMMA 30 wt % single layer sheet, and the GNP/PMMA 20 wt % single layer sheet manufactured in Preparation Example 3 were sequentially stacked to manufacture a sheet having a thickness of about 2.5 mm by a hot press (130° C., 30 MPa, and 10 min).

Comparative Example 3

The GNP/PMMA 40 wt % single layer sheet, the GNP/PMMA 30 wt % single layer sheet, and the GNP/PMMA 20 wt % single layer sheet manufactured in Preparation Example 3, and the Ni/PMMA 15 wt % single layer sheet manufactured in Preparation Example 4 were sequentially stacked to manufacture a sheet having a thickness of about 2.5 mm by a hot press (130° C., 30 MPa, and 10 min).

Experimental Example

The electromagnetic wave shielding effect was measured using the multi-layer sheets or the single-layer sheets manufactured in Examples and Comparative Examples above. The electromagnetic wave shielding effect was measured by a [vector network analyzer], and results thereof were shown in FIGS. 1 to 3.

First, FIG. 1 shows comparison between Example 1 and Comparative Example 1 in view of the electromagnetic wave shielding effect. As shown in FIG. 1, it could be confirmed that the electromagnetic wave shielding effect of Example was significantly improved even with the same thickness as compared to Comparative Example.

Figure 2:
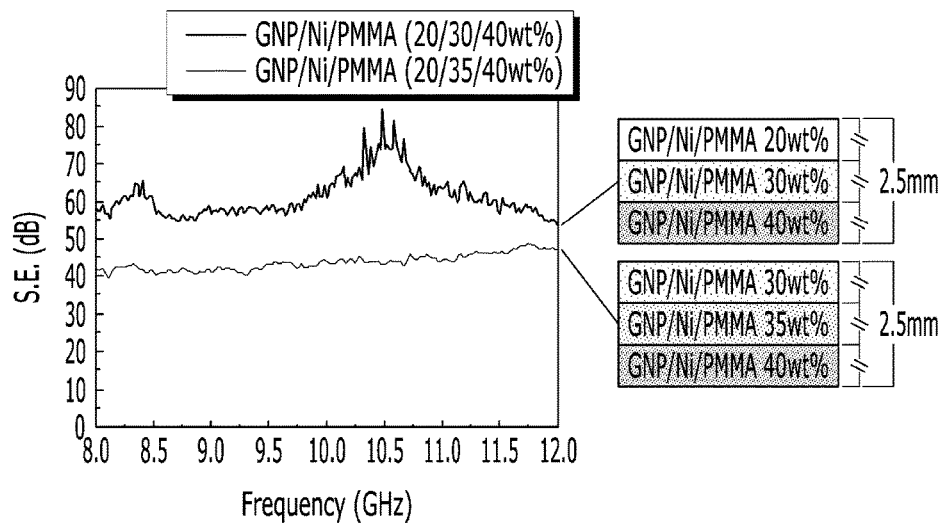
FIG. 2 shows results of comparison between Example 1 and Example 2 in view of an electromagnetic wave shielding effect.

In addition, FIG. 2 shows comparison between Example 1 and Example 2 in view of the electromagnetic wave shielding effect. As shown in FIG. 2, it could be confirmed that the electromagnetic wave shielding effect was improved by controlling the contents of the bonded GNP/Ni nanocomposite powder in the respective single layer sheets to have a difference of 10 wt %.

Figure 3:
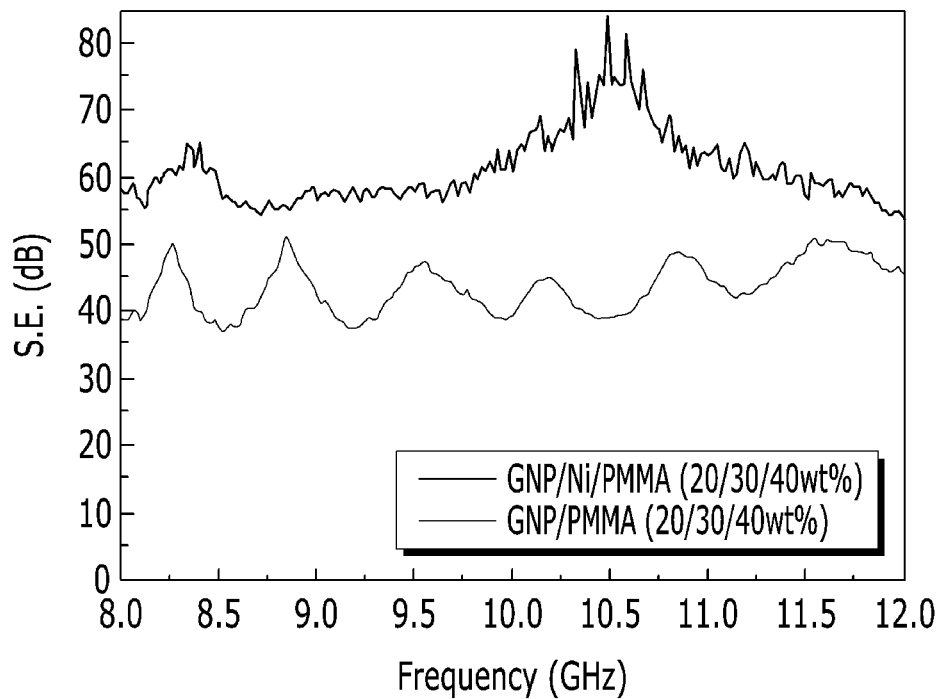
FIG. 3 shows results of comparison between Example 1 and Comparative Example 2 in view of an electromagnetic wave shielding effect.

Further, FIG. 3 shows comparison between Example 1 and Comparative Example 2 in view of the electromagnetic wave shielding effect. As shown in FIG. 3, it could be confirmed that the electromagnetic wave shielding effect of Example was significantly improved by including Ni as compared to Comparative Example.

Figure 4:
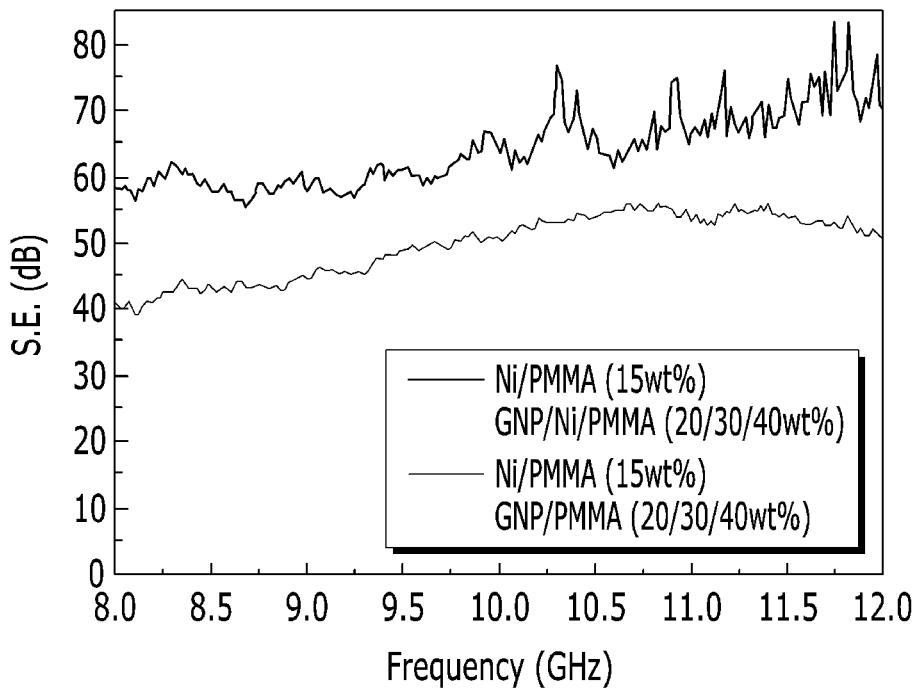
FIG. 4 shows results of comparison between Example 3 and Comparative Example 3 in view of an electromagnetic wave shielding effect.

Further, FIG. 4 shows comparison between Example 3 and Comparative Example 3 in view of the electromagnetic wave shielding effect. As shown in FIG. 4, it could be confirmed that the electromagnetic wave shielding effect of Example was significantly improved as compared to Comparative Example.

What is claimed is:
1. A multi-layer graphene-metal-polymer sheet for shielding electromagnetic wave comprising:
   a stack consisting of single layer sheets,
   wherein each single layer sheet is a single layer including a mixture of a graphene-metal nanocomposite powder and a polymer material,
   wherein the graphene-metal nanocomposite powder includes graphene bonded to metal nanoparticles,
   wherein a weight of the graphene-metal nanocomposite powder, relative to a total weight of a single layer sheet, is different in adjacent single layer sheets in the stack,
   wherein the contents of the graphene-metal nanocomposite powder ranges from 10 wt % to 70 wt % relative to a total weight in each single layer sheet.
2. The multi-layer graphene-metal-polymer sheet for shielding electromagnetic wave of claim 1,
   wherein each single layer sheet has a thickness ranging from 0.1 to 1.0 mm.

3. The multi-layer graphene-metal-polymer sheet for shielding electromagnetic wave of claim 1,
wherein the polymer material in each graphene-metal-polymer sheet is independently selected from the group consisting of polymethyl methacrylate (PMMA), epoxy, polystyrene, polyaniline (PANI), polyurethane, polyethylene, polypyrrole, polydimethylsiloxane (PDMS), polycarbonate (PC), polyvinyl chloride (PVC), polypropylene (PP), polyethylene terephthalate (PET), polyparaphenylene (PPP), polythiophene (PT), and polyisothionaphthene (PITN).

4. The multi-layer graphene-metal-polymer sheet for shielding electromagnetic wave of claim 1,
wherein the metal nanoparticles included in the graphene-metal nanocomposite powder in each graphene-metal-polymer sheet are, independently, Ni or Co nanoparticles.

5. The multi-layer graphene-metal-polymer sheet for shielding electromagnetic wave of claim 1,
wherein the metal nanoparticles included in the graphene-metal nanocomposite powder in each graphene-metal-polymer sheet have diameters independently ranging from 5 nm to 10 μm.

6. The multi-layer graphene-metal-polymer sheet for shielding electromagnetic wave of claim 1,
wherein a weight of the metal nanoparticles, relative to a total weight of the graphene and the metal nanoparticles in the graphene-metal nanocomposite powder ranges from 1 wt % to 50 wt %.

7. The multi-layer graphene-metal-polymer sheet for shielding electromagnetic wave of claim 1, further comprising:
a layer including a polymer and the graphene-metal nanocomposite powder or including a polymer and the metal nanoparticles on a surface of the stack.

8. The multi-layer graphene-metal-polymer sheet of claim 1, wherein the average diameter of the metal nanoparticles in each sheet is the same.

9. The multi-layer graphene-metal-polymer sheet for shielding electromagnetic wave of claim 1,
wherein a difference in the total weight of the graphene-metal nanocomposite powder in adjacent single layer sheets ranges from greater than 5 wt % to 10 wt %.

10. The multi-layer graphene-metal-polymer sheet for shielding electromagnetic wave of claim 9,
wherein the difference in the total weight of the graphene-metal nanocomposite powder in adjacent single layer sheets is 10 wt %.

* * * * *